United States Patent [19]

Dawson et al.

[11] Patent Number: 4,878,315

[45] Date of Patent: Nov. 7, 1989

[54] GRIDING GUIDE AND METHOD

[75] Inventors: Thomas F. Dawson, Millis; Paul C. Ewing, Tewksbury, both of Mass.

[73] Assignee: The Charles Stark Draper Laboratory, Inc., Cambridge, Mass.

[21] Appl. No.: 947,371

[22] Filed: Dec. 29, 1986

Related U.S. Application Data

[63] Continuation-in-part of Ser. No. 772,269, Sep. 3, 1985, Pat. No. 4,648,211.

[51] Int. Cl.[4] .............................................. B24B 49/10

[52] U.S. Cl. ............................... 51/165 R; 51/281 R; 29/593

[58] Field of Search ......................... 51/165 R, 281 R; 29/593, 603

[56] References Cited

U.S. PATENT DOCUMENTS

| | | | |
|---|---|---|---|
| 2,355,316 | 8/1944 | Mestas | 33/178 E |
| 3,027,683 | 4/1962 | Shapiro | 446/137 |
| 3,143,830 | 8/1964 | Arnold et al. | 51/165.74 |
| 3,685,209 | 8/1972 | Lambert | 51/165.74 |
| 3,691,695 | 9/1972 | Green et al. | 51/165 R |
| 3,787,638 | 1/1974 | Murai | 29/603 |
| 4,155,106 | 5/1979 | Maraoka | 29/603 |
| 4,208,783 | 6/1980 | Luther et al. | 29/593 |
| 4,337,566 | 7/1982 | DiMatteo et al. | 51/326 |
| 4,477,968 | 10/1984 | Kracke et al. | 29/593 |
| 4,648,211 | 3/1987 | Dawson et al. | 51/281 R |

OTHER PUBLICATIONS

Grandison, P. J., IBM Tech. Disclosure Bulletin, vol. 13, No. 4, Sep. 1970.

Hastie, W. M., "Gang Tackle", Circuits Manufacturing, Mar. 1986, p. 27.

*Primary Examiner*—Robert P. Olszewski

*Attorney, Agent, or Firm*—Joseph S. Iandiorio; Michael L. Sheldon; Brian M. Dingman

[57] ABSTRACT

A guide for the grinding of a surface of an object having a region to be exposed, including at least two conductive leads and a conductive control track. Each conductive lead is associated with a different face of the object, and the control track interconnects the leads and extends across the surface to be ground which lies between the faces. At least a portion of the rear edge of the track is precisely located with respect to a predetermined grinding depth of the region so that a break in the track occurs with the grinding of the surface to that grinding depth.

22 Claims, 9 Drawing Sheets

228 238 232 230 236 240 250 242 248 244 246 234

GRIDING GUIDE AND METHOD

RELATED APPLICATION

This application is a continuation-in-part of U.S. Ser. No. 772,269, filed Sept. 3, 1985 now U. S. Pat. No. 4,648,211, "Grinding Guide and Method of Controlling the Automatic Grinding of Objects", by Dawson et al.

FIELD OF INVENTION

This invention relates to an improved guide for the grinding of an object to accurately expose at a predetermined guiding depth a region in the object, and more particularly to such a grinding guide which is disposed on at least two faces of a printed circuit board coupon to provide individual control for a number of coupon grinding steps.

BACKGROUND OF INVENTION

Presently, grinding operations are controlled primarily by establishing timing intervals for each application of an abrasive to an object to be ground and by human observation of the rate at which the abrasives wear away the object being ground. In another control procedure, a grinding operator attempts to set mechanical stops at a level corresponding with the desired grinding depth for each grinding operation.

One such object to be ground is a coupon for a printed circuit board. Printed circuit boards provide the mounting surface and electrical interconnection system for components such as diodes, resistors and capacitors. While originally the circuit boards were only printed on a single side, most circuit boards today are double-sided or multilayered. Multilayer printed circuit boards, that is, circuit boards having circuits that are printed on several layers of the boards, require uniform, dependable electrical connections between the layers. These critical connections are typically provided by plated-through holes prepared by drilling holes through the stacked board layers. The drilled hole are plated with copper and then solder to establish the electrical interconnections. Each and every plated-through hole must maintain a predetermined, uniform thickness: pores, cracks, nodules and other faults in plating render the entire circuit board defective.

A number of printed circuit boards are typically defined on a single panel of material. Fortunately for inspection purposes, plating faults typically appear in most of the plated-through holes of a printed circuit board if any faults are present at all. Therefore, one or more coupons are defined on the panel for each circuit board to be printed. Each coupon has one or more test holes which are plated simultaneously with the plated-through holes. The coupons are labelled with a specific identification code for the individual board and are detached for later examination.

The test holes in the coupon are typically aligned with their centerlines in a plane perpendicular to the direction of grinding. They are examined after plating by accurately grinding one edge of the coupon to expose the test holes in cross-section. However, the greater the distance of the cross-section from the centerline, the greater is the error in measurement of actual plating thickness.

Unfortunately for inspection purposes, grinding is presently a tedious, time-consuming process since great accuracy is demanded. At least three or four steps are involved which are accomplished manually or semi-automatically by human supervision of a grinding machine. Typically, one or more coupons are mounted in a holder with one edge protruding. The holder is cast in a mold after the coupons are carefully arranged in the mold. The coupons are aligned in the mold using alignment pins which pass through tooling holes in the coupon. Potting material is then poured into the mold which hardens to form the holder. Grinding machines accept one or more holders in a disk which is equipped with a number of adjustable mechanical stops including hardened material such as diamond.

The protruding edge of each coupon is ground for several minutes against coarse grit rotating at several hundred rpm. The coarse grit is replaced with medium grit, which is rotated against the coupons for an additional one to two minutes. When a semi-automated machine is used, the operator removes the coupons from the medium grit after all diamond stops contact the grit; the operator then resets the diamond stops. Fine grit is then applied against the coupons for thirty to fifty seconds or until all the diamond stops again contact the abrasive. For the grinding machine, the diamond stops are reset flush with the holder. Finally, the coupons with their test holes exposed in cross-section are treated in one or more polishing steps.

The sheer cost and labor of grinding one or more coupons per circuit board present serious problems in view of the ever-increasing millions of printed circuit boards that are produced annually. Presently, most coupons are ground manually at the cost of $15-20 per coupon. Manual grinding requires constant operator attention and frequent inspection using a microscope. Each visual inspection interrupts the grinding operation. The dependability of the operator varies greatly: overgrinding and undergrinding occur frequently. Since the coupons are exposed destructively, a mistake in overgrinding is irreparable and results in the complete invalidation of the matching printed wire board unless a second coupon is available for complete regrinding. Undergrinding, when detected, is cured by returning the coupon to the operator, who must remount it and commence additional, unscheduled grinding.

Semi-automated or machine-assisted grinding also requires close operator attention. The machines are more dependable than grinding by hand but are not reliable for exposing small test holes due to cumulative sources of error. The tooling holes in one of the coupons can be misplaced relative to the plated-through holes to be examined which results in under- or overgrinding of the coupon. Further, the holder can be initially misaligned in the disk relative to the setting of the mechanical stops, and the stops themselves can wear over time. Also, several holders can be misplaced in a disk relative to each other.

One apparatus attempts to automate grinding by interconnecting two terminal strips with a shorting conductor that is deposited on a substrate to be ground. The grinding operation is controlled by the amount of current flow through the shorting conductor. This technique is relatively inaccurate, however, and relies on final finishing by hand.

Further, the terminal strips and shorting conductor are all deposited on the same face of the substrate. To expose an element passing through the substrate, such as a test hole to be exposed, controlled grinding along the thickness of the substrate is desired. In other words, control is desired along a grinding surface transverse to one or more faces of the substrate.

SUMMARY OF INVENTION

It is therefore an object of this invention to provide an improved grinding guide which accurately controls grinding along a surface transverse to one or more faces of an object to be ground.

It is a further object of this invention to provide an improved guide for the grinding of printed circuit board coupons to expose test holes.

Yet another object of this invention is to provide such a grinding guide which can use a separate plated-through hole to control grinding.

It is a further object of this invention to provide such a grinding guide which is adapted for fully automated grinding.

It is a further object of this invention to provide such a grinding guide which can accurately control a multiplicity of coupon grinding steps.

It is a further object of the invention to provide such a grinding guide which prevents overgrinding or undergrinding of coupons.

A still further object of this invention is to provide such a grinding guide which is disposed on the coupon itself.

The invention results from the realization that effective control of grinding of an object such as a printed circuit board coupon can be achieved using a control track mounted on the coupon along a surface transverse to two faces of the coupon each bearing a conductive lead connected to the track, the track positioned such that a break in the track occurs simultaneously with the grinding to a desired, predetermined position along the transverse surface of the coupon.

This invention features a guide for the grinding of a surface of an object having a region to be exposed. There are at least two conductive leads, each lead associated with a different face of the object, and a conductive control track interconnecting the conductive leads. The control track extends across the surface to be ground which lies between the faces, and at least a portion of the rear edge of the track is precisely located with respect to a predetermined grinding depth of the region so that a break in the track occurs with the grinding of the surface to that grinding depth.

In one embodiment, the control track penetrates the object to connect the conductive leads. The control track may include conductive material passing through a hole in the object between the different faces; such as where the conductive material is plated-through the control track hole. The region to be exposed may be a test hole formed by the same mechanism which formed the control track hole, and the conductive leads may be carried by the faces of the object.

This invention also features a guide for the grinding of a surface of a printed circuit board coupon having a test hole to be exposed, including at least two conductive leads, each lead exposed on a different face of the object, and a conductive control track interconnecting the conductive leads. The control track extends across the surface to be ground which lies between the faces, and at least a portion of the rear edge of the track is precisely located with respect to a predetermined grinding depth of the test hole.

In one embodiment, the control track penetrates the coupon to connect the conductive leads, and may include conductive material passing through a hole in the coupon between the different faces. The rear edge of the control track may be parallel to the test hole, and the conductive leads may be carried by the faces of the coupon.

This invention further features a guide for the grinding of a surface of an object, including a plurality of pairs of conductive leads spaced from each other, one lead of each pair associated with a different face of the object relative to the other lead of the pair, and a plurality of conductive control tracks, one for each pair of conductive leads. The control track for a pair interconnects the conductive leads of that pair and extends across the surface to be ground which lies between the faces associated with that pair.

This invention may also be expressed as a method of providing a guide for the grinding of a surface of an object to expose a region, including establishing, between two faces of the object, a conductive control track aligned in relation to a predetermined grinding depth for the region, attaching a pair of leads to the control track so that one lead is associated with each face, and positioning, between the leads, at least a portion of the rear edge of the track with respect to the predetermined grinding depth so that a break in the track occurs with the grinding of a surface to that grinding depth.

In one embodiment, the establishing and positioning include forming a hole through the object between the two faces and adding conductive material to the hole to develop the control track. Adding conductive material may include plating through the control track hole. The region to be exposed may be a test hole, and positioning of the rear edge of the control track and formation of the test hole may be accomplished by the same mechanism.

DESCRIPTION OF PREFERRED EMBODIMENTS

Other objects, features and advantages will occur from the following descriptions of preferred embodiments and the accompanying drawings, in which.

This invention may be accomplished by a grinding guide having a control track which lies between two faces of an object to be ground. A conductive lead is associated with each face of the object to establish a circuit through the control track. A portion of the rear edge of the control track is precisely located relative to a predetermined grinding depth of a region to be exposed in the object so that the track is ground through when the surface of the object is ground to the predetermined grinding depth. The control track may penetrate the object and involve a drilled hole to which conductive material is added to develop the control track.

Figure 1:
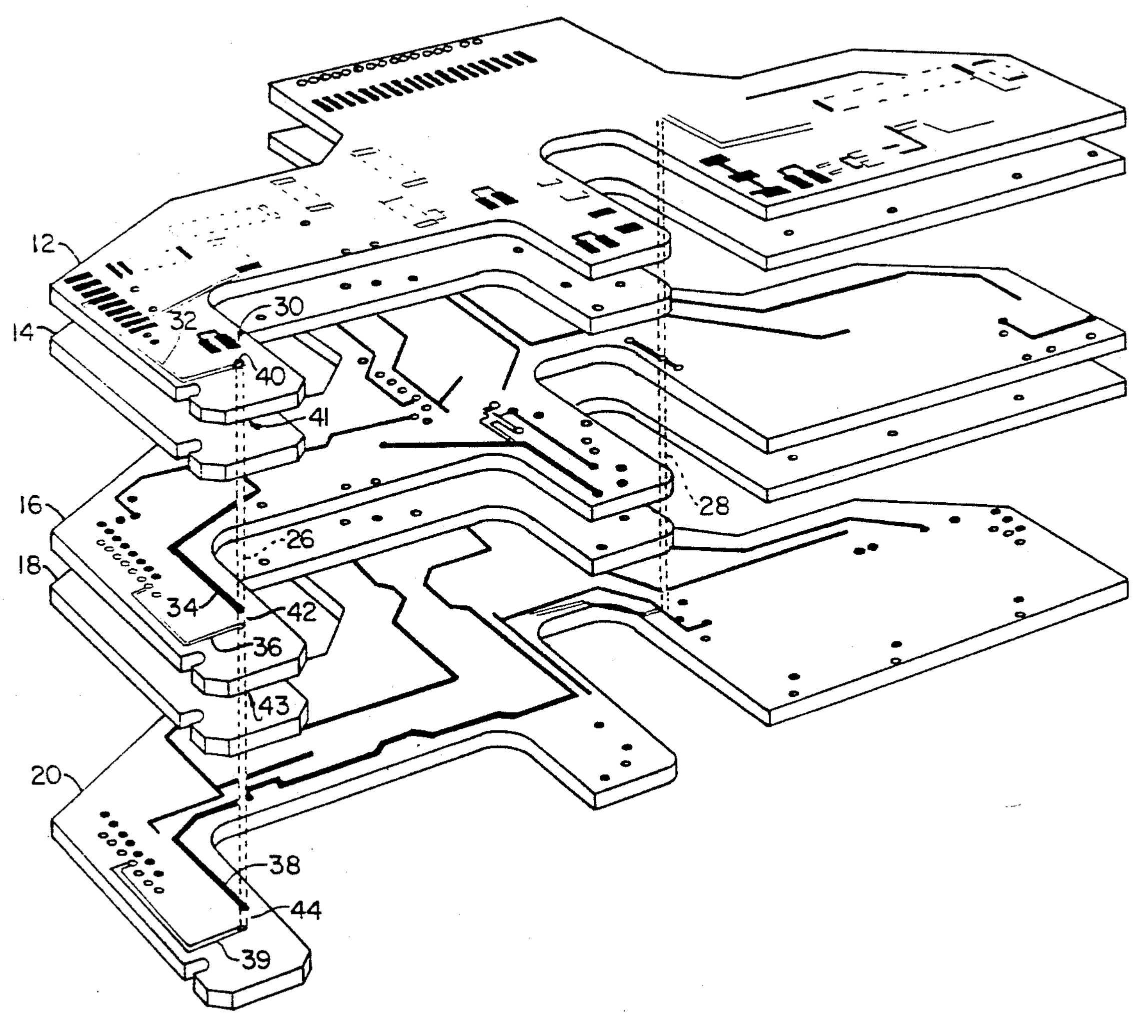
FIG. 1 is an exploded axonometric view of a conventional multi-layer printed circuit board.

While a grinding guide according to this invention can be utilized on objects such as coupons for single- or double-sided circuit boards, the grinding guide is particularly useful for the grinding of coupons for multilayer circuit boards, such as shown in FIG. 1, since a great deal of time and money is invested in each multilayer board. Multilayer printed circuit board 10 includes layers 12, 14, 16, 18, and 20. Circuit board layers 12, 16, and 20 are printed on both sides to place copper cladding on those layers to form the circuits. The circuits are insulated from each other by insulating layers 14 and 18, respectively. Circuits printed on the upper sides of board layers 12, 16, 20 are shown as solid lines while the printed circuits on the underside of these layers are indicated by open lines.

After assembly and alignment of the board layers and the insulating layers relative to each other, the boards are selectively plated to establish plated-through holes to complete the circuits; holes 26, 28, shown in phantom, represent the electrical interconnection provided by the plated-through holes. Components on mounts 30, for example, are interconnected to other components by lines 32, 34, 36, and 38 when holes 40, 41, 42, 43 and 44 in their respective layers are plated as a single plated-through hole as illustrated by hole 26.

Figure 2:
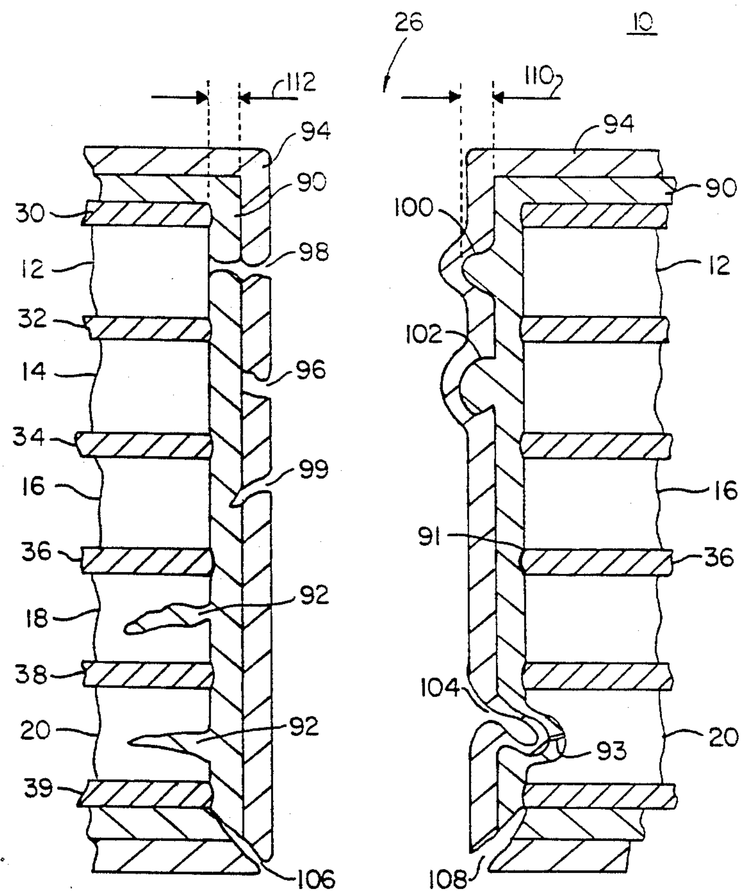
FIG. 2 is a cross-sectional view of an exposed plated-through hole in the multilayer circuit board of FIG. 1 illustrating potential faults in the plating operation.

Plated-through hole 26 of assembled multilayer circuit board 10, FIG. 1, is shown in cross-section in FIG. 2 to illustrate possible faults rising during the final plating-through stage of manufacture; these faults will hopefully be discovered by examining test holes in accompanying coupons. Printed circuit boards 12, 16 and 20 are shown with upper and lower copper cladding 30 and 32, 34 and 36, and 38 and 39, respectively. The circuits are separated internally by insulating layers 14, 18 unless a plated-through hole such as hole 26 electrically connects these circuits. After the layers are assembled together, an additional plating step plates copper cladding 90 through hole 26. Artifact 91 represents a resin smear that was not properly removed and which diminishes the electrical connection between cladding 36 and plating 90. Wicking 92 in the laminate indicate a weakened structure and the potential for short circuits between copper cladding circuits. Channel 93 is a hairline crack in plating 90.

Solder plating 94 is then plated over copper plating 90. Defect 96 indicates discontinuous plating while void 98 illustrates a void in the plating penetrating through both copper plating 90 and solder plating 94. Channel 99 represents a large crack which penetrates copper plating 90. While some defects such as nodule 100 are acceptable, copper plating 90 may develop an unacceptable nodule 102. Also unacceptable are plating pocket 104 and circumferential cracks 106, 108.

Finally, the platings themselves have specified thicknesses. Dimension arrows 110 indicate the range of desired plating thickness for solder plating 94, which is typically 0.0025 to 0.005 cm. Dimension arrows 112 represent that the range of acceptable widths for copper plating 90 is 0.0025 to 0.005 cm.

The need to determine the quality of plating-through is readily apparent. Also apparent is that individual electrical testing of each and every plated-through hole is expensive and time consuming. Further, destructive testing best exposes the defects yet cannot be performed on the printed circuit boards themselves. Separate coupons having a number of sacrificial test holes therefore provide a practical mechanism for ascertaining the plating quality.

Figure 3A:
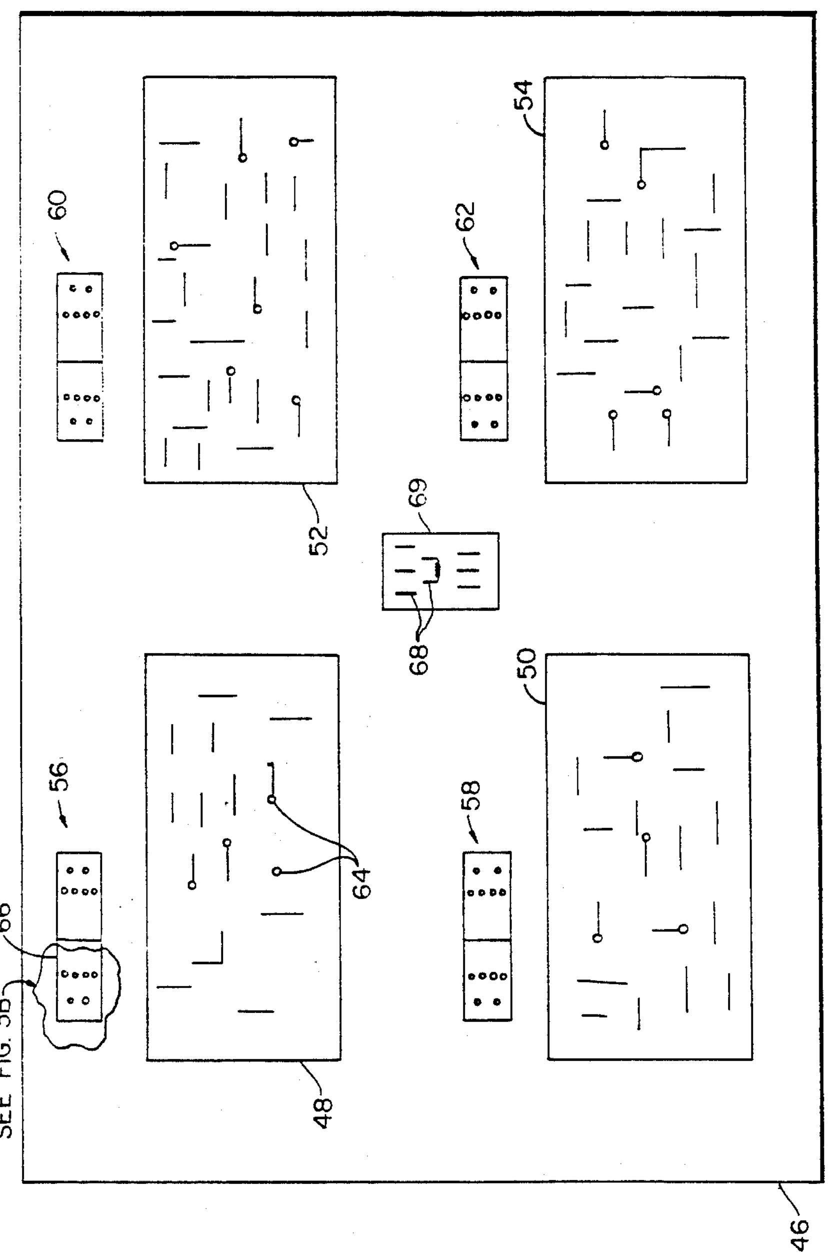
FIG. 3A is a schematic top plan view of conventional coupons and circuit boards disposed on a panel.

Typically, a number of circuit boards are printed on a single panel such as panel 46, FIG. 3A. Printed wire boards 48, 50, 52, and 54 have coupon pairs 56, 58, 60 and 62 located in close proximity on panel 46 to their respective printed wire boards. To test the quality of printing, lines 68 on coupon 69 are later stressed to assure proper plating. To test the quality of plated-through holes such as holes 64 in printed wire board 48, test holes on coupon 66 of coupon pair 56 are subsequently examined in cross-section.

Figure 3B:
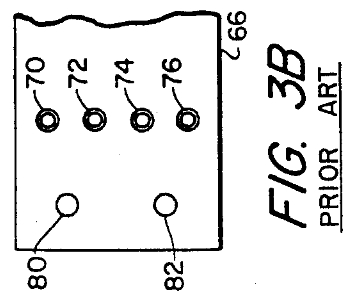
FIG. 3B is an enlarged view of one of the coupons of Fig. 3A.

Coupon 66 is shown in greater detail in FIG. 3B. Typically, test holes 70 and 72 are drilled before holes 64 are drilled and test holes 74 and 76 are drilled afterward to monitor the quality of the drill bit starting and finishing work on board 48. Test holes 70, 72, 74 and 76 are plated through simultaneously with holes 64.

Also shown are alignment holes 80, 82 used for conventionally aligning the coupons in a mold before potting material is added to form a holder which carries the coupon. Coupon 66 is removed from panel 46 using shears or a punch.

Figure 4:
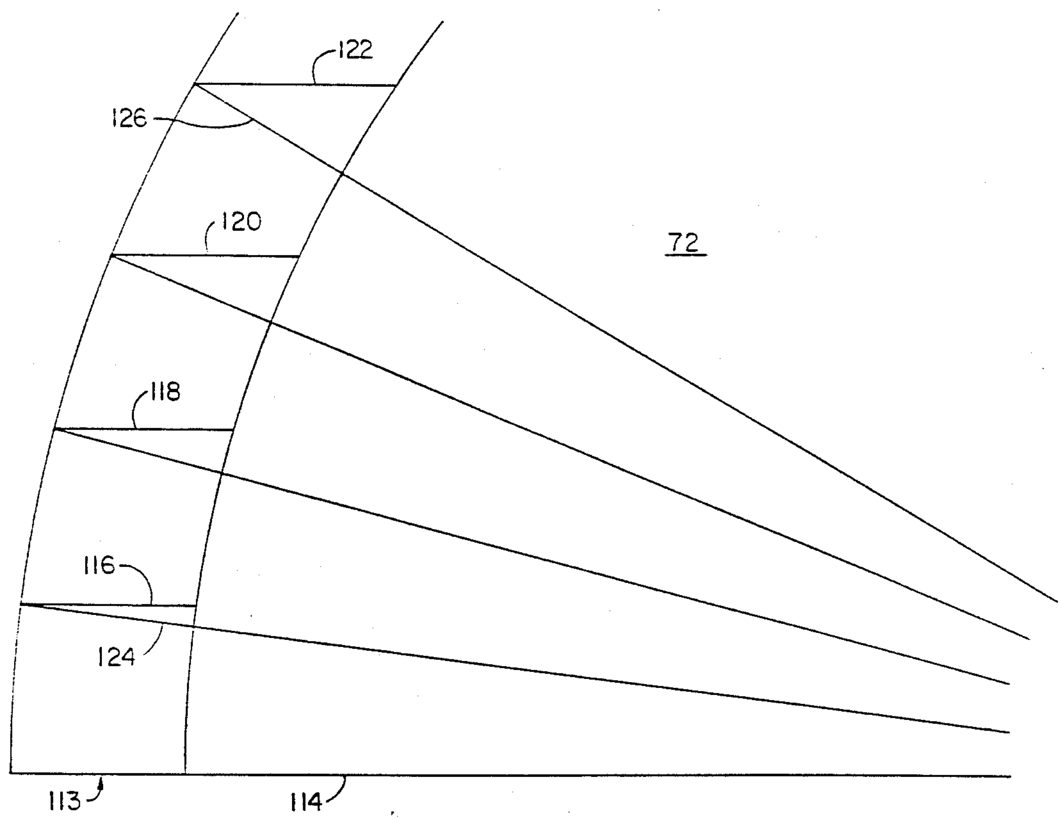
FIG. 4 is a chart of error arising during measurement of plating thickness relative to the distance of the cross section from the diameter of the test hole.

When test holes in a coupon are exposed in cross-section, the depth of exposure affects the measurement of plating thickness. FIG. 4 is a chart of error arising during the measurement of the thickness of copper plating 113 relative to the distance of the cross section from the diameter of plated-through hole 72, FIG. 3B. Line 114 represents a cross section corresponding with the diameter while lines 116, 118, 120 and 122 represent cross sections of exposure which are increasingly displaced from diameter 114. The measurement error with respect to displacement from diameter 114 in mils is shown in Table I when hole 72 is 16 mils and plating 113 is 1 mil.

TABLE I

| MIL DISPL | MEASUREMENT ERROR (mil) |
|---|---|
| 1.0 | 0.0250 |
| 2.0 | 0.0625 |
| 3.0 | 0.1000 |
| 4.0 | 0.1750 |

Cross section 116 is displaced 25.0 μm—1 mil—relative to line 114. The difference in length between radius line 124 within copper plating 90 and cross section 116 is 0.025 mil. Cross section 122 overestimates the true thickness represented by line 126 by 0.175 mil, which is a 17.5 percent measurement error.

Figure 5A:
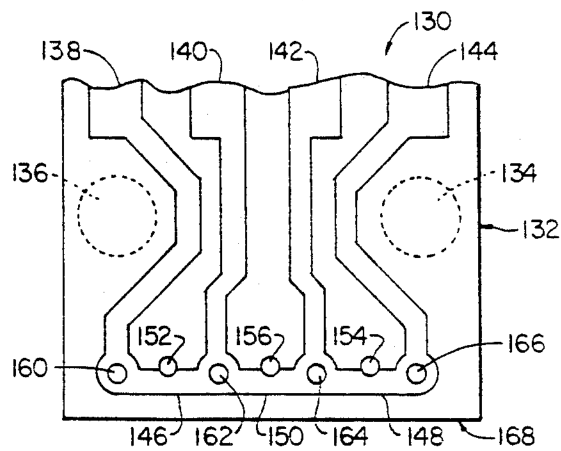
FIG. 5A is a top plan view of a novel grinding guide that is printed on a coupon.

Such errors from overgrinding and undergrinding can be prevented using novel grinding guide 130 as shown in FIG. 5A. Grinding guide 130 is mounted on coupon 132. Tooling holes 134, 136, shown in phantom, are not part of grinding guide 130 but are utilized during conventional handling and alignment of coupon 132. Grinding guide 130 includes conductive leads 138, 140, 142, and 144. Conductive leads 138 and 140 are interconnected by conductive control track 146, leads 142 and 144 are connected by track 148, and leads 140 and 142 are connected by track 150. Control holes 152, 154 and 156 define tracks 146, 148 and 150 as tracks which are successively broken during three grinding steps such as coarse, medium and fine grinding. While the control holes are shown as drilled holes, track material encompassed by hole 152, for example, can be removed by laser etching or other removal method.

Electrically conductive leads 138, 140, 142 and 144 are shown associated with plated-through test holes 160, 162, 164 and 166. As surface 168 of coupon 132 is being ground to expose those test holes in cross section, a break occurs first in track 146 as the grinding erodes material up to control hole 152. A circuit is formed by providing power to lead 140, or another lead responsive to track 150, and sensing current or voltage on lead 138. The circuit is broken when surface 168 is ground through track 146 to control hole 152. A predetermined grinding depth is thereby established by that control track.

After track 146 is breached, a lesser abrasive is applied to grinding surface 168 until track 148 is broken. Finally, grinding with a fine abrasive continues until track 150 is broken. When it is desirable to maintain positive power on a single lead rather than transferring power to successive leads as successive tracks are monitored, track 140 or 142 can be designated as a power lead and the remaining three tracks can be monitored for sudden drops in power indicating a broken track. Alternatively, one can sense an inductive pulse generated as the track is ground through.

Figure 5B:
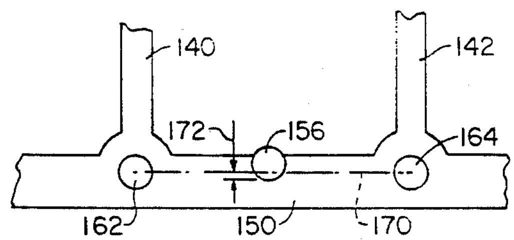
FIG. 5B is an enlarged detailed view of a portion of a control track of FIG. 5A showing its following edge aligned by a drilled hole.

Conductive leads 140, 142 and control track 150 are shown in an enlarged view in FIG. 5B. Control hole 156 is shown in relation to diameter 170 passing through the centers of test holes 162, 164. Dimension 172 illustrates that control hole 156 precedes diameter 170 by a small amount to ensure that the grinding machine conducting the grinding operation has sufficient time to retract coupon 132 from the abrasive and to allow some of surface 168 to be further eroded during polishing. For typical coupon grinding operations, the anticipation distance represented at 172 is 1 to 2 mil. Control track 154, FIG. 5A, anticipates the diameter of the test holes by 3 mil and coarse control track 152 anticipates by 6 mil.

Figure 6:
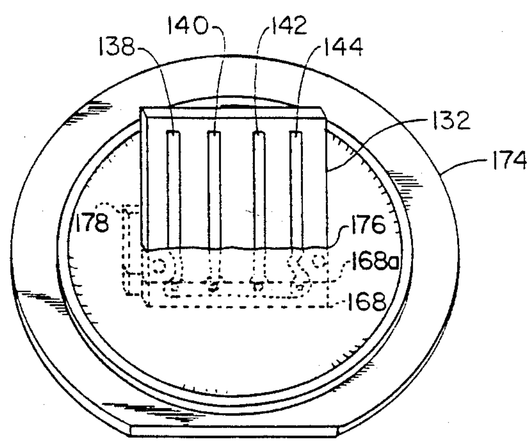
FIG. 6 is an axonometric view of the coupon of FIG. 5A embedded in a coupon mount.

To prepare coupon 132 for grinding, it is "potted" in potting material such as Epo-Kwik epoxy, available from Buehler, which hardens to form coupon mount 174, FIG. 6. Coupon 132 is surrounded by potting material up to line 176. During grinding, surface 168 of coupon 132 is ground down to surface **168*a***, indicated in phantom.

Conductive leads 138, 140, 142 and 144 are shown slightly raised in thickness so that they project somewhat from the surface of coupon 132. The projection facilitates mating with an edge connector of the grinding machine.

While individual grinding control per coupon is most accurately obtained by grinding a single coupon at a time, two or more coupons can be mounted in the same mount as indicated by coupon 178, shown in phantom. Additional coupons are aligned during potting relative to coupon 132, for example. It is desirable for the upper portion of each non-monitored coupon 178 not to extend far above upper potting material limit 176: physical interference with the interconnection of monitored coupon 132 and the grinding machine is thereby avoided. Coupon 132 is then monitored during grinding to control the grinding of all coupons in mount 174.

Figure 7:
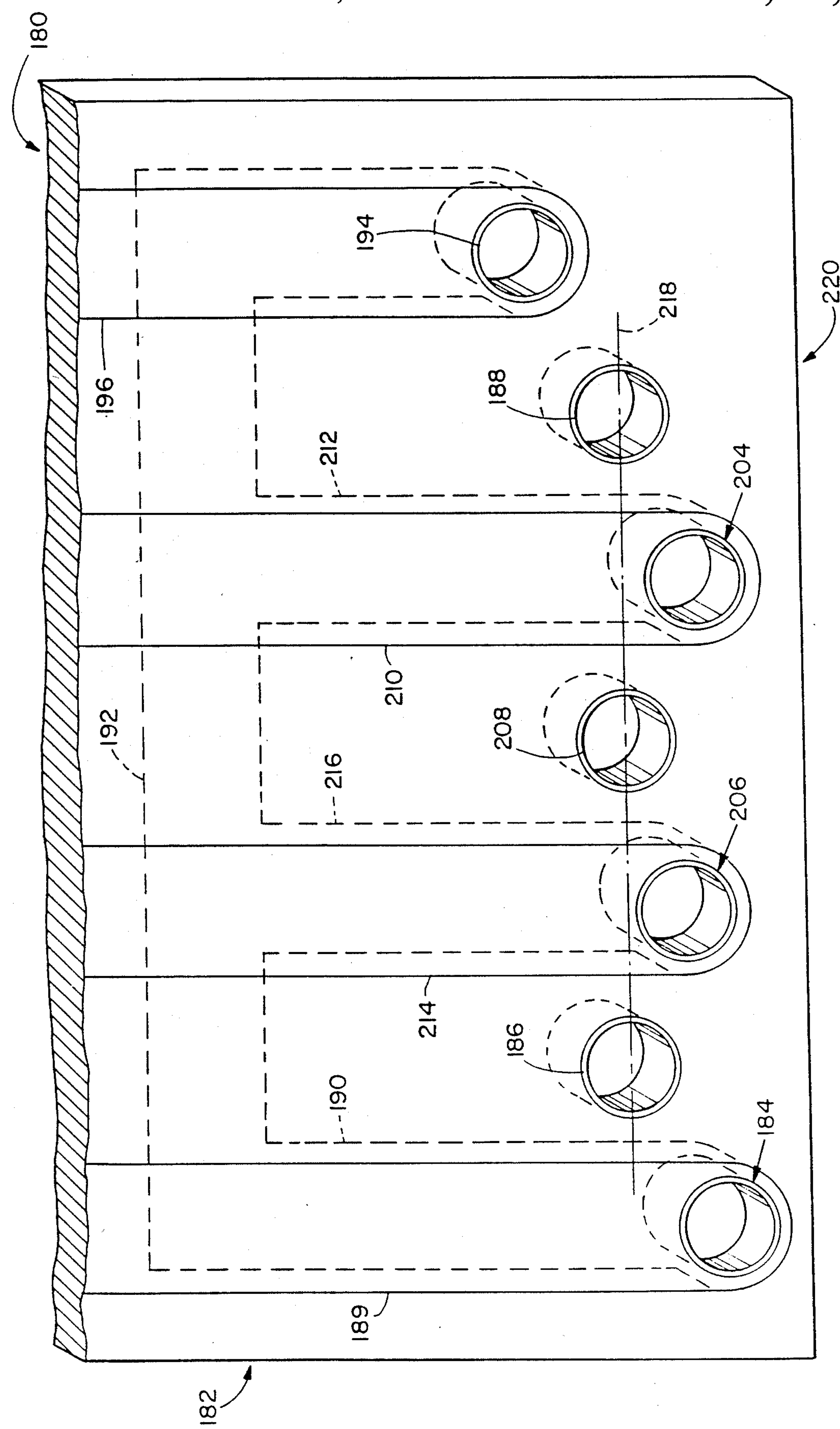
FIG. 7 is a top plan view of a grinding guide according to this invention printed on a coupon and utilizing drilled, plated-through holes as the control tracks.

Grinding guide 180 according to this invention, FIG. 7, is mounted on two different faces of coupon 182 which are interconnected by control track holes 184, 204, 206. Control track holes 184, 204, 206 are drilled and plated through during the same process in which test holes 208, 186, 188 are formed. Control track hole 204 interconnects upper conductive lead 210 with lower conductive lead 212, shown in phantom. Similarly, control track hole 206 interconnects upper conductive lead 214 with lower conductive lead 216, and control track hole 184 interconnects lead 189 with lead 190.

In this construction, grinding guide 180 mates with an edge connector having only four contacts, all of which are on the same plane. This convenient arrangement is achieved by connecting lower conductive leads 190, 216, 212 through common lead 192 and plated-through hole 194 to power-supply lead 196.

Figure 8A:
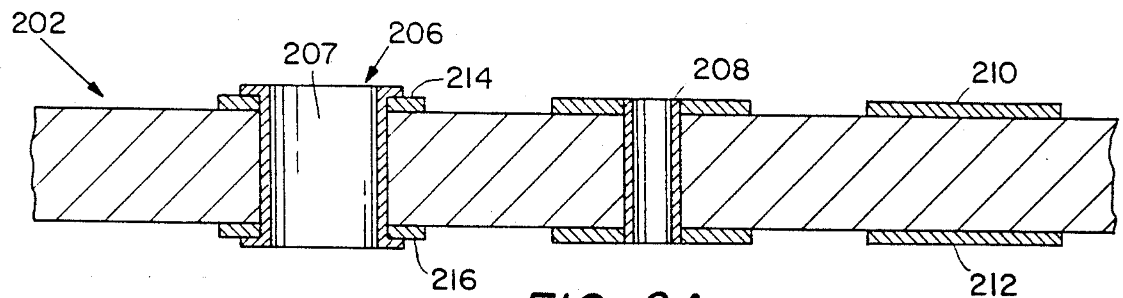
FIGS. 8A and 8B are schematic cross-sectional views of the coupon of FIG. 7 after successive stages of grinding.

The rear edges of control track holes 184, 204, 206 are precisely located with respect to the central line of test holes 186, 188, 208, indicated by dashed line 218. During grinding, an abrasive is applied to grinding surface 220 until the rear edge of each control track hole 184, 204, 206 is successively ground through. For example, control track hole 204 is ground through as shown in FIG. 8A. Test hole 208 is partially exposed, and test hole 206 is partially ground through. However, rear edge 207 remains intact at this stage.

After the rear edge of control track hole 204 is ground through, a lesser abrasive is applied until rear edge 207 of control track hole 206 is ground through. This occurs simultaneously with the exposure of the true cross-sectional diameter of test hole 208.

Control track holes 184, 204, 206 can be plated through with copper, copper and solder, or other conductive material. Further, this invention is not limited to plated-through holes. For example, a solid wire or rod can be passed through a hole previously drilled in a coupon.

Figure 8B:
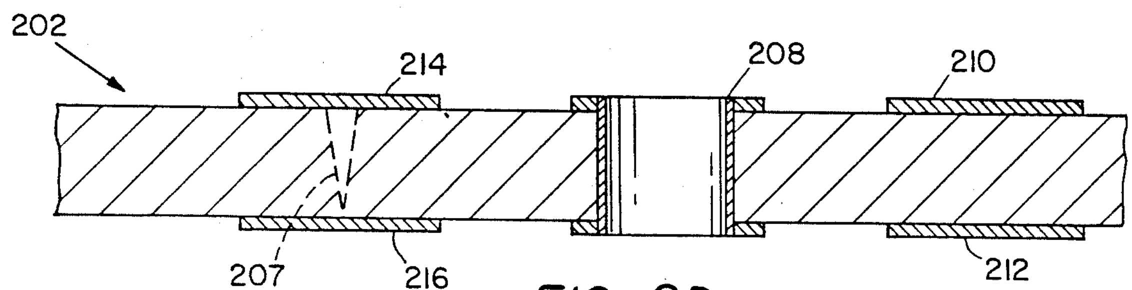

There are a number of advantages to establishing a control track through the thickness of the coupon, particularly where the item to be exposed also extends through the thickness of the coupon. For exposing test holes in circuit board coupons, positioning of the rear edge of the control track hole parallel to the test hole insures that the test hole will not be overground. As indicated in phantom in FIG. 8B, rear edge 207 of control track hole 206 may experience only partial breakthrough yet still halt the grinding operation. Thus, test hole 208 will not be overground or underground even if the plane of the abrasive is not parallel to control track hole 206.

Figure 9:
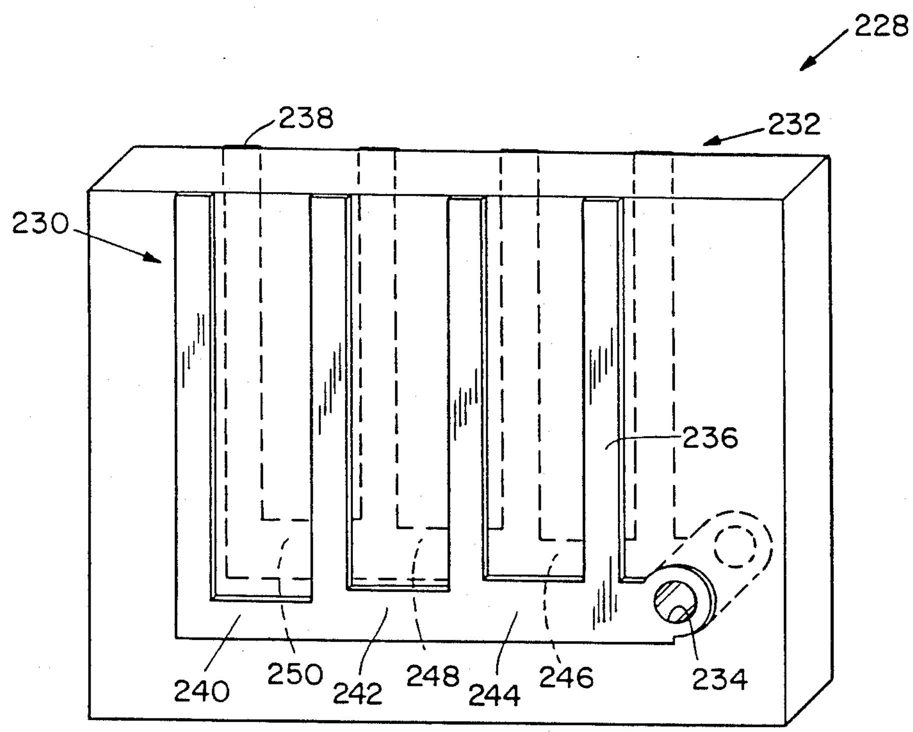
FIG. 9 is an axonometric view of two grinding guides according to this invention interconnected by a common plated-through hole to enable successive monitoring of the guides.

Grinding control system 228, FIG. 9, represents a combination of grinding guides 130 and 180. Control system 228 includes grinding guides 230, 232 connected by plated-through hole 234; control system 228 mates with a standard four-pin edge connector, but provides control over six grinding operations. Lead 236 serves as the common lead for grinding guide 230 while lead 238 serves as the common lead for grinding guide 232. During grinding, control tracks 240, 242 and 244 are successively ground through. The rear edge of common plated-through hole 234 is ground through simultaneously with the grinding of the rear edge of control track 244. Grinding guide 230 is thereby disconnected from the monitoring system (not shown), at which time the monitoring system commences monitoring of grinding guide 232. Control tracks 246, 248 and 250 are then monitored to control the last three grinding operations.

While the grinding guides are described above as guides for the grinding of printed wire board coupons having test holes to be exposed, this is not a limitation of the invention. Grinding guides according to this invention may be used to control the grinding of any object to be ground. The control tracks of the grinding guide for the object can be precisely located during manufacture of the object or can be applied afterward. For integrated or hybrid circuits, the grinding guide can be applied simultaneously to a carrier material using a photolithographic process. The carrier material can be a metal or a ceramic; the region to be exposed can be an integrated circuit chip capacitor or resistor.

Further, the grinding guide can be used to control the grinding of objects that do not include an electrical circuit. For example, the porosity of a ceramic can be determined by drilling a hole through the ceramic, establishing a control track through the hole, and grinding until the track is breached. The exposed surface is then examined for pore size and density. Wear, such as of a brake shoe, can be monitored by placement of a wire control track in the shoe. If the carrier material is sufficiently soft, a conductive rod serving as the control track can be rammed through the material without preforming a hole.

In another application, an intact casting is probed with X-rays or ultrasound to locate voids or other defects to be studied. Information provided by the X-ray is used to determine the precise location for the control track. The grinding guide is then directly applied to the casting or the casting is potted in alignment with a grinding guide carried by a separate object that s ground simultaneously with the casting.

Moreover, grinding depth can be controlled by monitoring an electrical parameter other than the occurrence of an open circuit. The resistance of the control track can be monitored for an increase above a preselected level. For two parallel tracks separated by a dielectric, the capacitance of the tracks can be monitored for a decrease below a preselected level. These parameters can also be utilized to control the speed or pressure of grinding.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A guide for the grinding of a surface of an object having a region to be exposed, comprising:

at least two conductive leads, each lead associated with a different face of the object; and a conductive control track that penetrates the object for interconnecting said conductive leads and extending across the surface to be ground which lies between said faces, at least a portion of the rear edge of said track being precisely located with respect to a predetermined grinding depth of the region so that a break in said track occurs with the grinding of the surface to that grinding depth.

2. The grinding guide of claim 1 in which said control track includes conductive material passing through a hole in the object between said different faces.

3. The grinding guide of claim 2 in which the conductive material is plated through said control track hole.

4. The grinding guide of claim 2 in which the region to be exposed is a test hole formed by the same mechanism which formed said control track hole.

5. The grinding guide of claim 1 in which said conductive leads are carried by said faces of the object.

6. A guide for the grinding of a surface of a printed circuit board coupon having a test hole to be exposed, comprising:

at least two conductive leads, each lead disposed on a different face of the object; and a conductive control track that penetrates the coupon for interconnecting said conductive leads and extending across the surface to be ground which lies between said faces, at least a portion of the rear edge of said track being precisely located with respect to a predetermined grinding depth of the test hole so that a break in said track occurs with the grinding of the surface to that test hole grinding depth.

7. The grinding guide of claim 6 in which said control track includes conductive material passing through a hole in the coupon between said different faces.

8. The grinding guide of claim 7 in which the conductive material is plated through said control track hole.

9. The grinding guide of claim 7 in which said rear edge of said control track hole is parallel to said test hole.

10. The grinding guide of claim 6 in which said conductive leads are carried by said faces of the coupon.

11. A guide for the grinding of a surface of an object having a region to be exposed, comprising:

a plurality of pairs of conductive leads spaced from each other, one lead of each pair associated with a different face of the object relative to the other lead of said pair; and a plurality of conductive control tracks, one for each pair of conductive leads, said track penetrating the object for interconnecting said conductive le ads of that pair and extending across the surface to be ground which lies between said faces associated with that pair, at least portion of the rear edge of said track being precisely located with respect to a predetermined grinding depth of the region so that a break in said track occurs with the grinding of the surface to that grinding depth.

12. The grinding guide of claim 11 in which each said control track includes conductive material passing through a hole in the object between said different faces.

13. The grinding guide of claim 12 in which the conductive material is plated through said control track hole.

14. The grinding guide of claim 12 in which the region to be exposed is a test hole formed by the same mechanism which formed said control track hole.

15. The grinding guide of claim 11 in which said conductive leads are carried by said faces of the object.

16. A method of providing a guide for the grinding of a surface of an object to expose a region, comprising:

forming a hole through the object between the two faces and adding conductive material to the hole to develop a conductive control track aligned in relation to a predetermined grinding depth for the region;

attaching a pair of leads to the control track, one lead associated with each face; and positioning, between the leads, at least a portion of the rear edge of the track with respect to the predetermined grinding depth so that a break in the track occurs with the grinding of the surface to that grinding depth.

17. The method of claim 16 in which adding conductive material includes plating through the control track hole.

18. The method of claim 16 in which the region to be exposed is a test hole, and positioning of the rear edge of the control track and formation of the test hole are accomplished by the same mechanism.

19. A method of providing a guide for the grinding of a surface of an object to expose a region, comprising:

penetrating, the object between two faces of the object, with a conductive control track aligned in relation to a predetermined grinding depth for the region;

attaching a pair of leads to the control track, one lead associated with each face; and positioning, between the leads, at least a portion of the rear edge of the track with respect to the predetermined grinding depth so that a break in the track occurs with the

20. The method of claim 19 in which penetrating and positioning include forming a hole through the object between the two faces and adding conductive material to the hole to develop the control track.

21. The method of claim 20 in which adding conductive material includes plating through the control track hole.

22. The method of claim 20 in which the region to be exposed is a test hole, and positioning of the rear edge of the control track and formation of the test hole are accomplished by the same mechanism.

* * * * *